United States Patent [19]

Popovic et al.

[11] Patent Number: 4,677,380
[45] Date of Patent: Jun. 30, 1987

[54] MAGNETIC FIELD SENSOR COMPRISING TWO COMPONENT LAYER TRANSISTOR OF OPPOSITE POLARITIES

[75] Inventors: Radivoje Popovic, Steinhausen, Switzerland; Heinrich P. Baltes, Edmonton, Canada; Tomislav Zajc, Zug, Switzerland

[73] Assignees: LGZ Landis; Gyr Zug Ag, both of Zug, Switzerland

[21] Appl. No.: 501,769

[22] Filed: Jun. 7, 1983

[30] Foreign Application Priority Data

Jun. 16, 1982 [CH] Switzerland ............... 3717/82

[51] Int. Cl.⁴ ............... G01R 33/02; G01R 33/00; H01L 27/22
[52] U.S. Cl. ............... 324/252; 357/27; 324/117 R
[58] Field of Search ............... 357/27, 23.14, 45, 35, 357/36; 324/252, 117 R, 117 H; 307/309

[56] References Cited

U.S. PATENT DOCUMENTS

| | | | |
|---|---|---|---|
| 3,486,085 | 12/1969 | Slavin | 357/27 |
| 3,610,968 | 10/1971 | Yamada | 307/309 |
| 3,714,523 | 1/1973 | Bate | 324/252 |
| 3,714,559 | 1/1973 | Bate | 324/252 |
| 3,829,883 | 8/1974 | Bate | 357/23.14 |
| 3,882,409 | 5/1975 | Yagi | 357/27 |

FOREIGN PATENT DOCUMENTS

| | | |
|---|---|---|
| 0035103 | 1/1981 | European Pat. Off. |
| 181853 | 12/1962 | Sweden ............... 324/252 |
| 886455 | 1/1962 | United Kingdom |

OTHER PUBLICATIONS

Vikulin et al, "A Magnetic Field Probe based on a Double Collector Transistor", Instruments & Experimental Techniques, vol. 17, No. 5, p. 12, pp. 1466-1467, Sep.-/Oct. 1974.

Vinal, "A Magnetic Sensor . . .", IBM J. Res. Develop., vol. 25, No. 3, May 1981, pp. 196-200.

Primary Examiner—Ernest F. Karlsen
Assistant Examiner—Walter E. Snow
Attorney, Agent, or Firm—Marmorek, Guttman & Rubenstein

[57] ABSTRACT

A magnetic field sensor having two component layer transistors of opposite polarities are cross connected together and give a higher degree of sensitivity, by virtue of that feedback effect. The magnetic field sensor serves for measuring a magnetic field and is supplied by way of a costant current source from a d.c. voltage supply. In an alternative embodiment, it has a working point adjusting circuit, a change-over contact circuit, and a voltage regulator for nullifying the offset voltage.

12 Claims, 15 Drawing Figures

MAGNETIC FIELD SENSOR COMPRISING TWO COMPONENT LAYER TRANSISTOR OF OPPOSITE POLARITIES

BACKGROUND OF THE INVENTION

This invention relates to magnetic field sensors including split-drain or split collector transistors.

U.S. Pat. No. 3,714,559 discloses a magnetic field sensor comprising a "split-drain" MOS-transistor. U.S. Pat. No. 3,714,523 discloses a magnetic field sensor comprising a "split-drain/split gate" MOS-transistor. An article in IBM J. Res. Develop. Vol. 25, No. 3, May 1981, entitled "A Magnetic Sensor Utilizing an Avalanching Semiconductor Device" by A. W. Vinal discloses a magnetic field sensor comprising a "split collector" bipolar transistor.

The magnetic field sensors disclosed in the two U.S. patents referred to above have a degree of sensitivity which is too low for certain uses. In such a situation, they additionally require an amplifier connected to the output thereof, with the disadvantage that the effects of its offset voltage and its noise are added to the effects of those of the magnetic field sensor. Although the magnetic field sensor described by Vinal has a high degree of sensitivity, it is unstable because of its operating in the avalanche effect range and the resultant injection of hot charge carriers into the oxide.

SUMMARY OF THE INVENTION

It is therefore a principal object of the present invention to provide a stable magnetic field sensor whose sensitivity is of the order of magnitude of 10 volts/tesla, without using an additional amplifier, and which can be produced by means of a standard MOS- or standard bipolar technology.

This object is achieved in a magnetic field sensor having two transistors of opposite polarities, each including at least one semiconductor layer that comprises two component layers. A first component layer of a first of the transistors is connected to a second component layer of the second of the transistors. The second component layer of the first transistor is connected to the first component layer of the second transistor. The two component layers of one of the two transistors form a two-pole output, and two equivalent semiconductor layers of the two transistors that are not divided into component layers form a supply voltage input of the magnetic field sensor.

Further objects and advantages of the invention will be set forth in part in the following specification, and in part will be obvious therefrom, without being specifically referred to, the same being realized and attained as pointed out in the claims thereof.

BRIEF DESCRIPTION OF THE DRAWINGS

The invention will now be further described, by way of an illustrative and non-limiting example, with reference to the accompanying drawings, in which the same reference numerals denote the same components in all the figures, and in which.

The magnetic sensors described hereinbelow include transistors each having at least one semiconductor layer that comprises two layers termed "component layers". In the views shown in FIGS. 1, 2, 3 and 9, the left-hand component layer is always referred to as the first component layer, and the right-hand component layer is always referred to as the second component layer. If the types of transistor are interchanged, then the polarities of the supply sources are also reversed.

DESCRIPTION OF THE PREFERRED EMBODIMENTS

Figure 1:
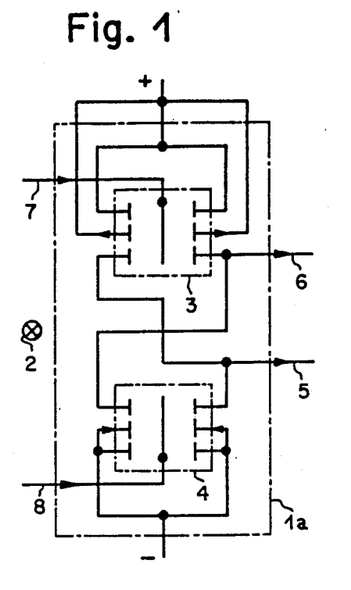
FIG. 1 is a circuit diagram that shows a magnetic field sensor with split drain semiconductor layers in accordance with an embodiment of the invention.

Referring now to the drawings, FIG. 1 is a schematic view of a magnetic field sensor 1a comprising MOS field effect transistors (MOSFETs) each having a split drain semiconductor layer. The sensor 1a is subjected to the influence of a magnetic field 2 to be measured, which acts perpendicular to the surface of the crystal thereof, and comprises a first component layer transistor 3, for example of P-type, and a second component layer transistor 4, for example of N-type. The two transistors 3, 4 are therefore of opposite polarities. Each of the two transistors 3 and 4 has only a single split semiconductor layer, such layer being the drain semiconductor layer in the illustrated example. The source and the substrate layers are thus not split. However, they are schematically illustrated as split, solely in order to be able to use the conventional transistor representations. The presence of such "component layers," which is only for the purposes of the drawing, is schematically indicated by an electrical short-circuit connection between the two "component layers" illustrated.

The source and the substrate layers of the first transistor 3 are connected to the positive pole of a d.c. voltage supply, while those of the second transistor 4 are connected to the negative pole of the supply. The first component layer of the drain semiconductor layer of the first transistor 3 is connected to the second component layer of the drain semiconductor layer of the second transistor 4 and forms a first output pole 5 of a two-pole magnetic field sensor. The second component layer of the drain semiconductor layer of the first transistor 3 is connected to the first component layer of the drain semiconductor layer of the second transistor 4 and forms a second output pole 6 of the magnetic field sensor. The gate semiconductor layer of the first transistor 3 forms a first single-pole input 7 of the magnetic field sensor 1a while that of the second transistor 4 forms a second single-pole input 8 of the magnetic field sensor 1a.

Figure 2:
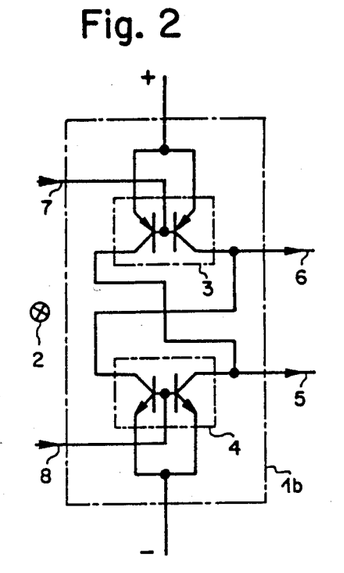
FIG. 2 is a diagram similar to FIG. 1, but showing a modification.

FIG. 2 is a schematic view of a magnetic field sensor 1b with split collector semiconductor layers. The circuit shown in FIG. 2 corresponds to that shown in FIG. 1, except that (i) the MOS-transistors with split drain semiconductor layers are replaced by bipolar transistors with split collector semiconductor layers, (ii) there are no bulk terminals, and (iii) the emitters take over the function of the sources and the bases take over the function of the gates.

Figure 3:
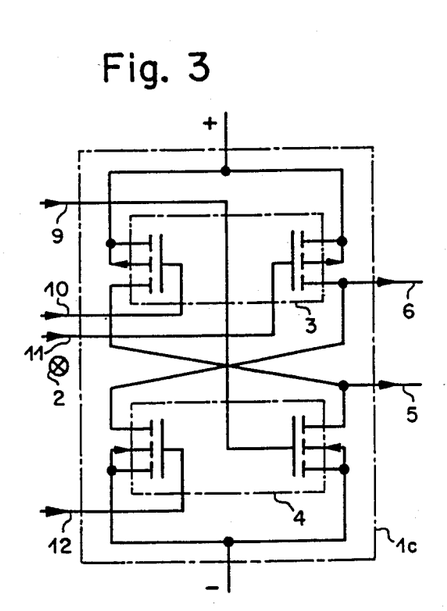
FIG. 3 is a diagram similar to the preceding, but showing a further modification.

FIG. 3 is a schematic view of a magnetic field sensor 1c with split drain and split gate semiconductor layers. The circuit in FIG. 3 corresponds to the circuit shown in FIG. 1, except that it has four instead of two single-pole inputs, one for each component layer of the two gate semiconductor layers. Of the gate semiconductor layers, the second component layer of the second transistor 4 is connected to a first input 9 of the magnetic field sensor 1c, the first component layer of the first transistor 3 is connected to a second input 10 of the magnetic field sensor, the second component layer of the first transistor 3 is connected to a third input 11 of the magnetic field sensor, and the first component layer of the second transistor 4 is connected to a fourth input 12 of the magnetic field sensor.

Each of the two component layer transistors 3 and 4 operates as a magnetic field sensor, in a manner known per se, in accordance with the state of the art described in the introduction hereto. By virtue of these interconnections of the two transistors 3 and 4, the voltages produced by the common magnetic field 2 in each of the transistors are added together so that the sensitivity of the magnetic field sensor is greatly increased, for example it may be doubled. The circuits shown in FIGS. 1 and 3 may also be manufactured by means of CMOS-technology. The circuits shown in each of FIGS. 1 to 3 are self-stabilizing in respect of fluctuations in temperature and supply voltage, and each of their component layer transistors has a high dynamic load.

Figures 5, 6:
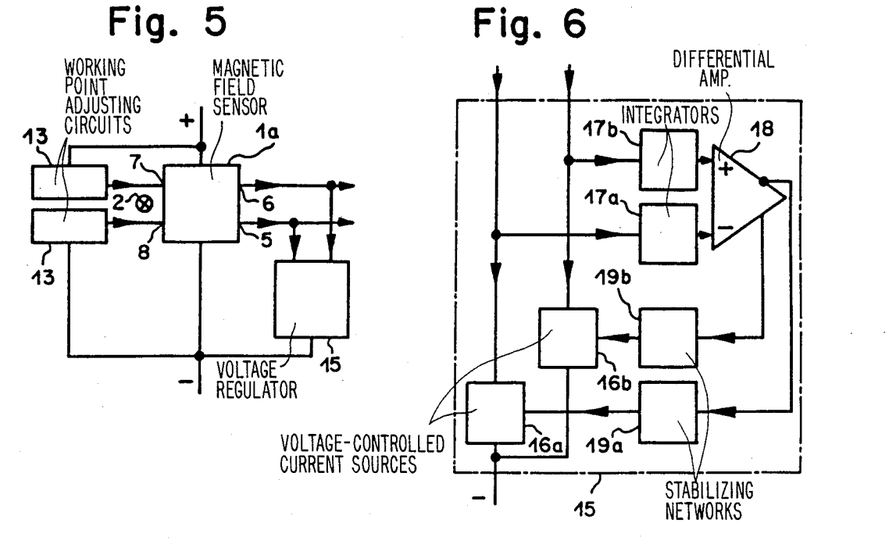
FIG. 5 is a diagram that shows an expanded magnetic field sensor with working point adjustment and offset voltage correction.
FIG. 6 is a diagram that shows a voltage regulator for controlling an offset voltage of the magnetic field sensor.
Figure 7:
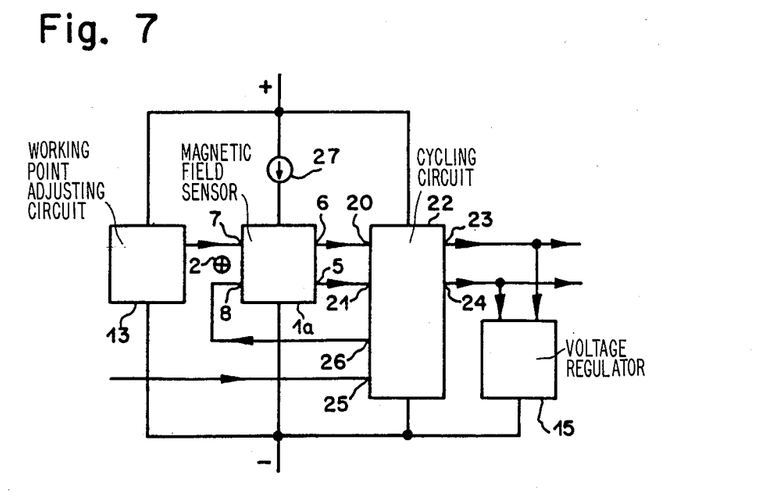
FIG. 7 is a diagram that shows an expanded magnetic field sesor with working point adjustment, offset voltage correction and output signal change-over control action.
Figure 9:
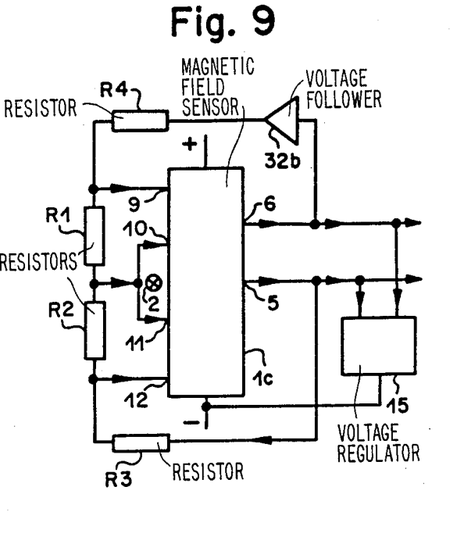
FIG. 9 is a diagram that shows an expanded magnetic field sensor with a feedback network.

The inputs 7 and 8 respectively, and 9, 10, 11 and 12 respectively of the two illustrated; magnetic field sensors provide for adjustment of the working point by means of a working point adjusting circuit, for example as shown in FIGS. 5 and 7 or FIG. 9, respectively. The input voltages are to be so selected that, on the one hand, both component layer transistors are in a saturation mode and thus represent good high dynamic load resistances, and, on the other hand, the output voltage of the magnetic field sensor assumes the mean value of the supply voltages, that is to say, for example in the case of CMOS-components, the value $(V_{DD}+V_{SS})/2$, wherein $V_{DD}$ represents the drain supply voltage and $V_{SS}$ represents the source supply voltage.

Figure 4:
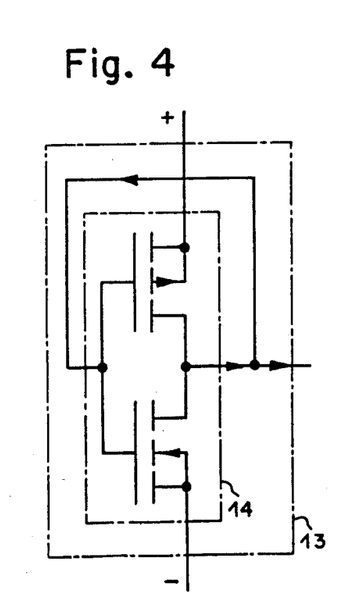
FIG. 4 is a circuit diagram that shows a working point adjusting circuit comprising a CMOS-inverter.

When (for example) using a circuit as shown in FIG. 1; the working point adjusting circuit most readily comprises a CMOS-inverter 14 with feedback provided by means of a short-circuit connection, that is to say, a working point adjusting circuit 13 as shown in FIG. 4.

The CMOS-inverter 14 includes a P-type and an N-type MOS-transistor, the two gates of which are interconnected and form an input of the CMOS-inverter 14, while the two drains are interconnected and form an output of the inverter. The source and the substrate of the P-type transistor are connected to the positive pole of the d.c. voltage supply, while those of the N-type transistor are connected to the negative pole. It is best for the transistors of the CMOS-inverter 14 to be of the same or proportional dimensions as the component layer transistors of the magnetic field sensor. The mode of operation of the circuit shown in FIG. 4 is known per se from the McMos Handbook issued by Motorola, Phoenix, Ariz., U.S.A. for any feedback resistance.

FIG. 5 is a block diagram of an expanded magnetic field sensor with working point adjustment and zero voltage correction. Outputs of two working point adjusting circuits 13 are respectively connected to two inputs 7 and 8 of the magnetic field sensor 1a which is subjected to the action of the magnetic field 2. Connected in parallel with the magnetic field sensor's two output poles 5,6 is a voltage regulator 15 which controls the offset voltage $U_{Offset}$ of the magnetic field sensor 1a to have the value zero. The circuit 13 and the magnetic field sensor 1a are supplied by a common d.c. voltage supply source, the negative pole of which is also connected to the negative supply terminal of the voltage regulator 15.

As the magnetic field sensor 1a has a two-pole output it is possible to use a voltage regulator 15 as shown in FIG. 6. Each pole of the two-pole input of the voltage regulator 15 is connected on the one hand directly to a first pole of a respective one of a pair of voltage-controlled current sources 16a and 16b and, on the other hand, by way of integrator 17a and 17b, respectively, to inverting and non-inverting inputs of a differential amplifier 18. The inverting and non-inverting outputs of the differential amplifier 18 control respective control inputs of the voltage-controlled current sources 16a and 16b, respectively, by way of respective stabilizing networks 19a and 19b. The two second poles of the current sources 16a and 16b are connected together and to the negative supply terminal of the voltage regulator 15. The two integrators 17a and 17b are, for example RC-circuits. In the simplest case, it is possible to omit the differential amplifier 18 and the stabilizing networks 19a and 19b. Simple forms of the voltage-controlled current sources 16a and 16b are for example P-type field effect transistors.

A voltage regulator 15 as shown in FIG. 6 can only be used for eliminating the offset voltage $U_{Offset}$ if the magnetic field 2 to be measured is an alternating magnetic field, since it is only then that the following equation applies:

$$\int_0^\infty H \cdot dt = 0,$$

where H denotes the magnetic field and t denotes time. In that case, integration of the output signal $(k \cdot H + U_{Offset})$ of the magnetic field sensor gives the following result, which is only dependent on the zero voltage $U_{Offset}$:

$$\int_0^\infty (k \cdot H dt + U_{Offset} \cdot dt) = \int_0^\infty U_{Offset} \cdot dt.$$

The integration time of the integrators 17a and 17b, for example the RC value of the RC circuits, must be made much greater than the period of the alternating magnetic field, in that arrangement.

Any d.c. component which occurs in the magnetic field 2 to be measured goes into $U_{Offset}$ and is also eliminated. That is an advantage in regard to any slowly varying interference and leakage fields that may occur. A disadvantage is, that a d.c. field component, the measurement of which is desired at some event, is also suppressed.

FIG. 7 is a schematic view of an expanded magnetic field sensor with working point adjustment, zero voltage correction and an output signal change-over control, keying or scanning action. The working point adjusting circuit 13 controls the first input 7 of the magnetic field sensor 1a, the two-pole output 5;6 of which is applied directly to a two-pole signal input 20;21 of a change-over control or cycling circuit 22. A two-pole signal output 23;24 of the circuit 22 forms an output of the expanded magnetic field sensor, which output has the voltage regulator 15 connected in parallel thereto. A control input 25 of the circuit 22 is controlled by a square or rectangular high-frequency clock signal while a feedback output 26 of the circuit 22 is connected to the second input 8 of the magnetic field sensor 1a. The working point adjusting circuit 13 and the circuit 22 are fed directly, and the magnetic field sensor 1a by way of a direct current source 27, by a common d.c. voltage source 27, the direct current supply being disposed between the positive pole of the d.c. voltage supply and the positive supply terminal of the magnetic field sensor 1a. The negative supply terminal of the voltage regulator 15 is connected to the negative pole of the d.c. voltage supply.

Figure 8:
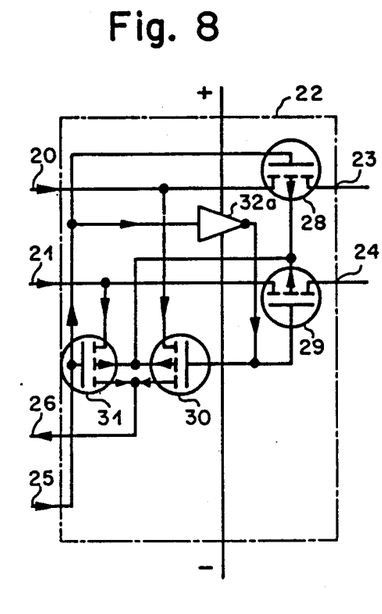
FIG. 8 is a schematic view that shows a change-over control circuit.

FIG. 8 shows the change-over control circuit 22. The first pole 20 of its signal input 20;21 is connected to the first pole 23 of its signal output 23;24 by way of a first switch 28, and the second pole 21 is connected to the second pole 24 of the signal output 23;24, by way of a second switch 29. The first pole 20 of the signal input 20;21 is also connected by way of a third switch 30 to the common feedback output 26, while its second pole 21 is connected by way of a fourth switch 31 to the common feedback output 26. The control input 25 directly controls the control inputs of the first and fourth switches 28 and 31 and, by way of an inverter 32a that is known per se (for example a MC 14000 inverter available from Motorola, Phoenix, Ariz., USA), the control inputs of the second and third switches 29 and 30. The four switches 28 to 31 are, for example P-type field effect transistors. Their substrates are then connected to the negative pole of a d.c. voltage supply which in turn also feeds the inverter 32a. The four switches 28 to 31 may also be transmission gates that are known per se, for example MC 14016 gates available from Motorola.

The first and third switches 28 and 30 together form a first change-over switch 28;30 which alternately connects the first pole 20 of the signal input 20;21 of the circuit 22 to the first pole 23 of the signal output 23;24 and to the feedback output 26. Likewise, the second and fourth switches 29 and 31 together form a second change-over switch 29;31 which alternately connects the second pole 21 of the signal input 20;21 to the second pole 24 of the signal output 23;24 and to the feedback output 26. The two change-over switches are operated in a push-pull mode by means of the high-frequency clock signal which is applied at the control input 25. Therefore, during each scanning phase, one pole 6 or 5 of the magnetic field sensor output, as shown in FIG. 7, is connected to the associated pole 23 and 24 respectively of the signal output 23;24 of the extended magnetic field sensor, while the other pole 5 or 6 is directly fed back, by way of a short-circuit connection, to the second input 8 of the magnetic field sensor 1a or 1b.

Figure 12A:
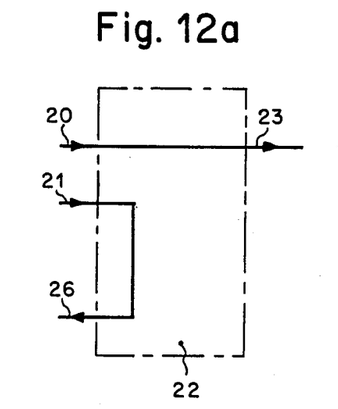
FIG. 12a is a schematic of one mode of the change-over control circuit.
Figure 12B:
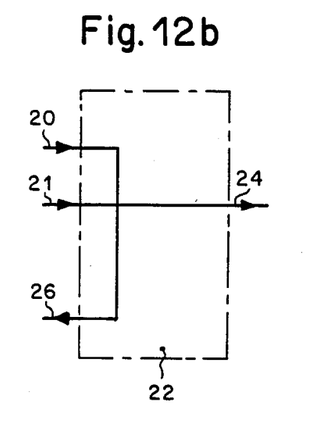
FIG. 12b is a schematic of a second mode of the change-over control circuit.

It is also possible for each switch of one of the two pairs of switches 28;31 and 29;30 in the circuit 22 to be replaced by a short-circuit connection, and for the other pair of switches to be omitted (FIG. 12a and FIG. 12b respectively). Or, in other words: the closed contacts of the two change-over switches 28;30 and 29;31 can each be replaced by a respective short-circuit connection. This gives an expanded magnetic field sensor having a single-pole output as shown in FIG. 12a and FIG. 12b. If that is to be avoided, and if a two-pole output is required, the above-described circuit 22 is employed. The positive and negative poles respectively of the output signal of the magnetic field sensor 1a or 1b are then alternately sampled at the high frequency. Due to the 180° phase shift of the signals at the two sampled signal poles, the degree of sensitivity of the extended magnetic field sensor is doubled. Further processing of a high-frequency signal is also much easier.

FIG. 9 shows an expanded magnetic field sensor having a feedback system. The second and third inputs 10 and 11 of the magnetic field sensor 1c are connected directly together and are connected by way of a first resistor R1 to the first input 9 of the magnetic field sensor 1c and by way of a second resistor R2 to the fourth input 12 of the magnetic field sensor 1c. In addition, the first pole 5 of the magnetic field sensor two-pole output 5;6 is applied by way of a third resistor R3 to the fourth input 12, and the second pole 6 of said output is applied to the first input 9 of the magnetic field sensor 1c by way of a series circuit comprising a voltage follower 32b and a fourth resistor R4. Connected in parallel with the two-pole output 5;6 is a voltage regulator 15, the negative supply terminal of which is connected to the negative pole of a d.c. voltage supply which supplies the magnetic field sensor 1c. An advantage of this circuit is that the magnitude of the feedback effect can be freely selected by means of the four resistors, so that it is possible to adjust for a high degree of sensitivity.

In a perfectly symmetrical circuit as shown in FIG. 9, the voltages at the two poles of the output 5;6 are of the same value when there is no magnetic field 2 present. When a magnetic field 2 is present, there is an asymmetry in the current distribution in respect of the two paths, as shown on the left-hand side and on the right-hand of the drawing, of the first component layer transistor 3 of the magnetic field sensor 1c (see FIG. 3). If the right-hand half carries more current than the left-hand half, then the voltage at the pole 6 of the output 5;6 rises and the voltage at the pole 5 of said output falls. Since, however, the first input 9 is connected to the second pole 6 of the output 5;6 by way of a voltage divider formed by the resistors R4 and R1, the voltage at the first input 9 will also rise, which in turn causes a rise in the current in the right-hand half, as shown in the drawing, of the second component layer transistor 4. That in turn additionally reduces the voltage of the first pole 5 of the output 5;6. It will be appreciated that a similar situation accordingly also applies in regard to the left-hand half, as shown in the drawing, of the second component layer transistor 4, the input 12 of which is connected to the first pole 5 of the output 5;6 by way of a further voltage divider formed by the resistors R3 and R2. The sensitivity of the magnetic field sensor 1c is increased by the above-described positive feedback effects.

The circuit shown in FIG. 9 suffers from the disadvantage that the spacings between the component layers of the gates must be very small and "charge coupled device" technology is accordingly required for manufacturing purposes. If, however, the four external feedback resistors R1 to R4 in FIG. 9 are integrated into the gate material, that disadvantage is eliminated, and the result is a construction as shown in FIG. 10.

Figure 10:
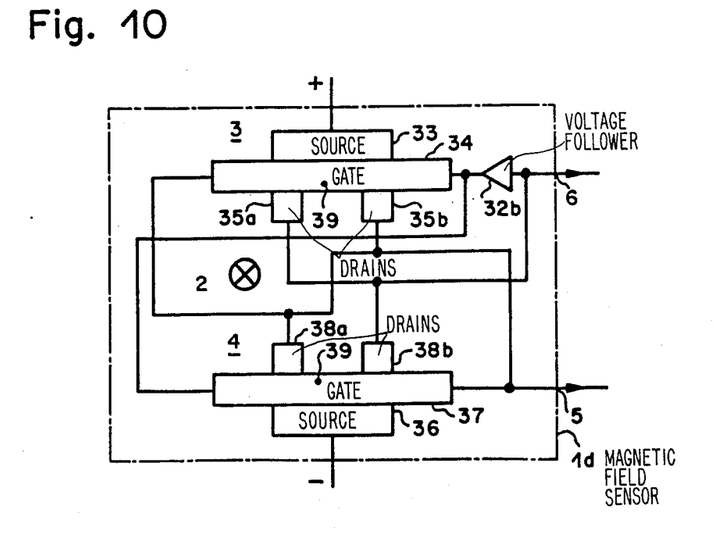
FIG. 10 is a diagram that shows a magnetic field sensor with gate material of finite but very high resistivity.

FIG. 10 is a schematic view of a magnetic field sensor 1d having a wide gate, the material of which has a finite but very high resistivity. The first component layer transistor 3 comprises a source 33, a gate 34 and a drain with a first drain component layer 35a and a second drain component layer 35b. The second transistor 4 of opposite polarity comprises a source 36, a gate 37 and a drain having a first drain component layer 38a and a second drain component layer 38b. Each gate 34, 37 is very wide and, as already mentioned, comprises a material with finite but very high resistivity. Each gate 34, 37 has a terminal at each of its two ends. The first of these terminals and the first drain component layer is shown on the left in the drawing, while the second terminal and the second component layer are shown on the right.

The following are directly connected together:
the first gate terminal and the second drain component layer 35b of the first component layer transistor 3, to the first drain component layer 38a and the second gate terminal of the second component layer transistor 4 and to the first pole 5 of the magnetic field sensor two-pole output 5;6;

the input of the voltage follower 32b and the first drain component layer 35a of the first transistor 3, to the second drain component layer 38b and the second pole 6 of the magnetic field sensor two-pole output 5;6; and the output of the voltage follower 32b to the second gate terminal of the first component layer transistor 3 and the first gate terminal of the second component layer transistor 4.

Under the influences of an electrical voltage at the two ends of the gates, an electrical current flows through the gates so that the central portion 39 of the gate resistances acts as a feedback resistance. That feedback effect amplifies the output signal of the magnetic field sensor 1d and thus increases its sensitivity. In addition, the properties of this circuit are less dependent on the properties of the component layer transistors than is the case with the other circuits described above.

The voltage follower 32b, comprising, for example an amplifier with a voltage gain of unity or a source follower, serves in the circuits shown in FIGS. 9 and 10, by virtue on its high-resistance input, to relieve the load on the output 5;6 of the magnetic field sensor 1c or 1d, so that the feedback resistors are no longer directly connected in parallel with the output 5;6.

Figure 11A:
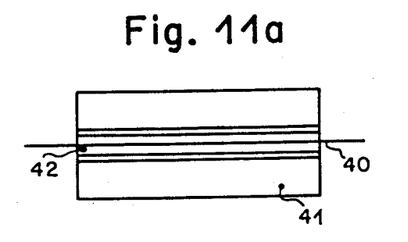
FIG. 11a is an elevational view of a magnetic core with a current conductor and magnetic field sensor.
Figure 11B:
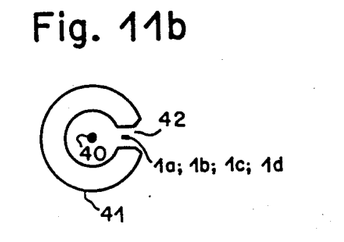
FIG. 11b is an end elevational view thereof.
Figure 11C:
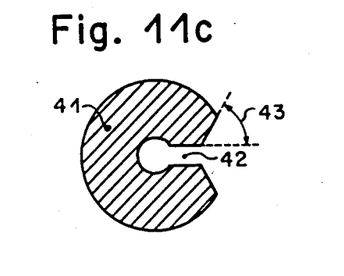
FIG. 11c is a sectional view thereof.

The above-described magnetic field sensors can be used for example for measuring the electrical current in an electricity meter. An advantageous arrangement, which is shown in FIGS. 11a and 11b, provides that a conductor 40 carrying the electrical current is arranged along the longitudinal axis of an elongated annular magnetic core 41 of soft-magnetic material, for example Mu-metal, the core being slotted along its length to form an air gap 42. A magnetic field sensor 1a, 1b, 1c or 1d is disposed in the air gap 42. FIG. 11c shows the cross-section of the air gap 42, the magnetic core side surfaces of which extend parallel to each other and parallel to the surface of the magnetic field sensor 1a, 1b, 1c, or 1d, at the side towards the interior of the ring. On the other hand, on the side towards the outside of the ring, they diverge at double the angle 43, the angle 43 being for example 60°, which causes the magnetic core 41 to be relieved of magnetic load. That has the result that it is in turn not saturated, when the alternating current to be measured is a 200 A current, so that the influence of nonlinearity of the magnetic material on measuring error remains low, and, on the other hand, the influence of an external interference field, of the order of magnitude of 50 A/cm, on the magnetic field sensor, is at a minimum level, because the magnetic core 41 serves at the same time as a magnetic screen. The sensor is of such dimensions that it can be assumed to be punctiform, in a first approximation, in relation to the dimensions of the magnetic core side surfaces of the air gap 42, and is arranged in the part of the air gap which has parallel side surfaces.

I wish it to be understood that I do not desire to be limited to the exact details of construction shown and desired, for obvious modifications will occur to a person skilled in the art.

Having thus described the invention, what I claim as new and desire to be secured by Letters Patent is as follows:

1. A magnetic field sensor comprising:
    first and second field effect transistors of opposite polarity type, each of said transistors having a first split layer which is a split drain layer divided into first and second component semiconductor regions and second and third layers, at least one of which is not split,
    the first component region of the split layer of said first transistor being connected to the second component region of the split layer of the second transistor,
    the second component region of the split layer of said first transistor being connected to the first component region of the split layer of said second transistor, each pair of interconnected component regions forming one pole of a two-pole output of said sensor,
    one non-split layer from each of said first and second transistors being source layers said source layers forming supply voltage inputs for said sensor.

2. A magnetic field sensor comprising:
    first and second transistors of opposite polarity type, each of said transistors having a first split layer divided into first and second component semiconductor regions and second and third layers, at least one of which is not split,
    the first component region of the split layer of said first transistor being connected to the second component region of the split layer of the second transistor,
    the second component region of the split layer of said first transistor being connected to the first component region of the split layer of said second transistor, each pair of interconnected component regions forming one pole of a two-pole output of said sensor, one non-split layer from said first transistor and the corresponding non-split layer from said second transistor forming supply voltage inputs for said sensor, wherein each third layer of said first and second transistors is not split and is connected to an output of at least one CMOS-inverter having a feedback connection to an input thereof, the CMOS-inverter comprising transistors that have spatial dimensions that are the same as or proportional to the spatial dimensions of said first and second transistors.

3. A magnetic field sensor comprising:

first and second transistors of opposite polarity type, each of said transistors having a first split layer divided into first and second component semiconductor regions and second and third layers, at least one of which is not split, the first component region of the split layer of said transistor being connected to the second component region of the split layer of the second transistor, the second component region of the split layer of said first transistor being connected to the first component region of the split layer of said second transistor, each pair of interconnected component regions forming one pole of a two-pole output of said sensor, one non-split layer from said first transistor and the corresponding non-split layer from said second transistor forming supply voltage inputs for said sensor, wherein one component region of the split layer of one of said first and second transistors is connected to the third semiconductor layer of the same transistor, which third layer is free from being divided into component regions, the other component region of said split layer of said one transistor forming a single-pole output of the magnetic field sensor, and a pole of the supply voltage input is supplied by a constant current source.

4. A magnetic field sensor comprising:

first and second transistors of opposite polarity type, each of said transistors having a first split layer divided into first and second component semiconductor regions and second and third layers, at least one of which is not split, the first component region of the split layer of said first transistor being connected to the second component region of the split layer of the second transistor, the second component region of the split layer of said first transistor being connected to the first component region of the split layer of said second transistor, each pair of interconnected component regions forming one pole of a two-pole output of said sensor, one non-split layer from said first transistor and the corresponding non-split terminal from said second transistor forming supply voltage inputs for said sensor, wherein two changeover switches operable in a push-pull mode are provided for alternately connecting, in a first mode, the first component region of the split layer of one of the first and second transistors to the first pole of a signal output of the magnetic field sensor and the second component region of said split layer of said one transistor to the third semi-conductor layer thereof, which third layer is free from being divided into component layers and, in a second mode, the first component region of the split layer of said one transistor to its third semiconductor layer and the second component region of said split layer of said one transistor to the second pole of the signal output, and wherein a pole of the supply voltage input is supplied by a constant current source.

5. A magnetic field sensor according to claim 4, wherein the change-over switches are formed by field effect transistors.

6. A magnetic field sensor comprising:

first and second transistors of opposite polarity type, each of said transistors having a first split layer divided into first and second component semiconductor regions and second and third layers, at least one of which is not split, the first component region of the split layer of said first transistor being connected to the second component region of the split layer of the second transistor, the second component region of the split layer of said first transistor being connected to the first component region of the split layer of said second transistor, each pair of interconnected component regions forming one pole of a two-pole output of said sensor, one non-split layer from said first transistor and the corresponding non-split layer from said second transistor forming supply voltage inputs for said sensor, wherein the third layer in each of said transistors is divided into first and second component regions, and wherein the two component regions of the third semiconductor layer of the first transistor are directly connected together and are connected by way of respective resistors to the component regions of the third semiconductor layer of the second transistor, and the first region of the third semiconductor layer of the second transistor is connected by way of a third resistor to the first component region of the first layer of the first transistor and the second component region of the third semiconductor layer of the second transistor is connected by way of a fourth resistor to an output of a voltage follower, an input of which voltage follower is connected to the second component region of the first layer of the first transistor.

7. A magnetic field sensor comprising:

first and second field effect transistors of opposite polarity type, each of said transistors having a first split layer which is a split drain layer divided into first and second component semiconductor regions and second and third layers, the third layer of each transistor is a gate layer, each of said gate layers being wide, being of material having finite but very high resistivity and having respective terminals at each of its two ends, the second layer from each of said first and second transistors is a source layer, said source layers forming supply voltage inputs for said sensor, wherein the first drain component region of the first transistor is connected directly to the second drain component region of the second transistor and a second pole of a two-pole magnetic field sensor output and by way of a voltage follower to a gate terminal of the first and second transistors, and the second drain component region of the first transistor is connected to the first drain component region of the second transistor and to the other gate terminals of the first and second transistors and to the first pole of the two-pole magnetic field sensor output.

8. A magnetic field sensor comprising:
first and second bipolar transistors of opposite polarity type, each of said transistors having a first split layer which is a collector layer divided into first and second component semiconductor regions, and second and third layers, at least one of which is not split,
the first component region of the said split collector of said first transistor being connected to the second component region of the said split collector of the second transistor,
the second component region of the split collector of said first transistor being connected to the first component region of the split collector of said second transistor, each pair of interconnected component regions forming one pole of a two-pole output of said sensor,
one non-split layer from each of said first and second transistors is an emitter layer, said emitter layers forming supply voltage inputs for said sensor.

9. A magnetic field sensor comprising:
first and second transistors of opposite polarity type, each of said transistors having a first split layer divided into first and second component semiconductor regions and second and third layers, at least one of which is not split,
the first component region of the split layer of said first transistor being connected to the second component region of the split layer of the second transistor,
the second component region of the split layer of said first transistor being connected to the first component region of the split layer of said second transistor, each pair of interconnected component regions forming one pole of a two-pole output of said sensor,
one non-split layer from said first transistor and the corresponding non-split terminal from said second transistor forming supply voltage inputs for said sensor,
wherein a voltage regulator is connected in parallel with the two-pole output of said magnetic field sensor, the voltage regulator being operative to nullify the offset voltage of the magnetic field sensor and comprising a respective integrator, stabilizing network and voltage-controlled current source per output pole, and a single differential amplifier, said voltage-controlled current sources also being connected to a negative supply terminal.

10. A magnetic field sensor according to claim 9, wherein the integrators are RC-circuits.

11. A magnetic field sensor comprising:
first and second transistors of opposite polarity type, each of said transistors having a first split layer divided into first and second component semiconductor regions and second and third layers, at least one of which is not split,
the first component region of the split layer of said first transistor being connected to the second component region of the split layer of the second transistor,
the second component region of the split layer of said first transistor being connected to the first component region of the split layer of said second transistor, each pair of interconnected component regions forming one pole of a two-pole output of said sensor,
one non-split layer from said first transistor and the corresponding non-split layer from said second transistor forming supply voltage inputs for said sensor,
said magnetic field sensor being arranged in an elongate air gap of a cylindrically annular magnetic core with its surface parallel to magnetic core side surfaces of the air gap, wherein the two dimensions of said magnetic core side surfaces are much larger than the dimensions of the magnetic field sensor, and wherein an electrical conductor for carrying an electrical current to be measured is arranged along the longitudinal axis of the magnetic core.

12. A magnetic field sensor according to claim 11, wherein the magnetic core side surfaces of the air gap extend substantially parallel to each other and substantially parallel to the surface of the magnetic field sensor, on the side towards the interior of the core, whereas on the side towards the exterior of the core they diverge at a double angle and the magnetic core in that arrangement forms a magnetic screen.

* * * * *